United States Patent
Sato et al.

(10) Patent No.: US 11,746,407 B2
(45) Date of Patent: Sep. 5, 2023

(54) METHOD FOR MANUFACTURING DEPOSITION MASK, METHOD FOR MANUFACTURING DISPLAY DEVICE AND DEPOSITION MASK

(71) Applicant: TOPPAN PRINTING CO., LTD., Tokyo (JP)

(72) Inventors: Shunsuke Sato, Tokyo (JP); Reiji Terada, Tokyo (JP); Naoko Mikami, Tokyo (JP)

(73) Assignee: TOPPAN PRINTING CO., LTD., Tokyo (JP)

( * ) Notice: Subject to any disclaimer, the term of this patent is extended or adjusted under 35 U.S.C. 154(b) by 26 days.

(21) Appl. No.: 17/510,345

(22) Filed: Oct. 25, 2021

(65) Prior Publication Data

US 2022/0042160 A1 Feb. 10, 2022

Related U.S. Application Data

(63) Continuation of application No. 16/816,181, filed on Mar. 11, 2020, now Pat. No. 11,180,843, which is a
(Continued)

(30) Foreign Application Priority Data

Sep. 15, 2017 (JP) .................................. 2017-178223

(51) Int. Cl.
*H01L 51/00* (2006.01)
*C23C 14/04* (2006.01)
(Continued)

(52) U.S. Cl.
CPC .......... *C23C 14/042* (2013.01); *C23C 14/588* (2013.01); *C23C 14/5813* (2013.01); *H10K 71/166* (2023.02)

(58) Field of Classification Search
CPC ..... C23C 14/042; C23C 14/24; C23C 16/042; C23C 14/04; C23C 14/5813;
(Continued)

(56) References Cited

U.S. PATENT DOCUMENTS 10,697,069 B2 * 6/2020 Shinno ...................... C25D 1/10
10,767,266 B2 * 9/2020 Shinno ...................... C23F 1/02
(Continued)

FOREIGN PATENT DOCUMENTS

| CN | 106350768 A | 1/2017 |
|---|---|---|
| JP | 2017-145491 A | 8/2017 |
| WO | WO 2017/057621 A1 | 4/2017 |

OTHER PUBLICATIONS

International Search Report and Written Opinion with translation of international Search Report for PCT Application PCT/JP2018/034083 dated Nov. 6, 2018, 9 pages.

*Primary Examiner* — Jaehwan Oh
(74) *Attorney, Agent, or Firm* — Squire Patton Boggs (US) LLP

(57) ABSTRACT

A method includes: sandwiching a plastic layer between a glass substrate and a metal plate made of an iron-nickel alloy and joining the metal plate to the glass substrate with the plastic layer in between; forming a mask portion including a plurality of mask holes from the metal plate; joining a surface of the mask portion that is opposite to a surface of the mask portion that is in contact with the plastic layer to a mask frame, which has a higher rigidity than the mask portion and is in a shape of a frame surrounding the mask holes of the mask portion; and peeling off the plastic layer and the glass substrate from the mask portion.

4 Claims, 4 Drawing Sheets

Related U.S. Application Data continuation of application No. PCT/JP2018/034083, filed on Sep. 13, 2018.

(51) Int. Cl.
 *C23C 14/58* (2006.01)
 *H10K 71/16* (2023.01)

(58) Field of Classification Search
 CPC ............. H01L 51/0011; H01L 21/0275; H01L 21/0332; H01L 21/3086
 See application file for complete search history.

(56) References Cited

U.S. PATENT DOCUMENTS

| | | | |
|---|---|---|---|
| 10,982,316 B2* | 4/2021 | Obata | H10K 50/11 |
| 2018/0038002 A1 | 2/2018 | Tamura et al. | |
| 2018/0065162 A1* | 3/2018 | Mikami | C23F 1/28 |
| 2018/0066352 A1 | 3/2018 | Tamura et al. | |
| 2018/0138410 A1 | 5/2018 | Fujito et al. | |
| 2018/0148822 A1* | 5/2018 | Takeda | C23C 16/042 |
| 2018/0277799 A1* | 9/2018 | Ikenaga | H10K 50/11 |
| 2018/0312979 A1* | 11/2018 | Shinno | B21B 1/38 |
| 2019/0078194 A1* | 3/2019 | Shinno | C23C 14/042 |
| 2019/0100834 A1* | 4/2019 | Sakio | C23C 14/042 |
| 2019/0112699 A1* | 4/2019 | Shinno | C23F 1/02 |
| 2019/0112715 A1* | 4/2019 | Shinno | C21D 9/52 |
| 2019/0211437 A1* | 7/2019 | Obata | H10K 71/166 |
| 2019/0237349 A1* | 8/2019 | Ikenaga | B32B 15/012 |
| 2020/0362465 A1* | 11/2020 | Shinno | C23C 14/042 |
| 2021/0407800 A1* | 12/2021 | Shinno | H01L 21/67248 |

\* cited by examiner

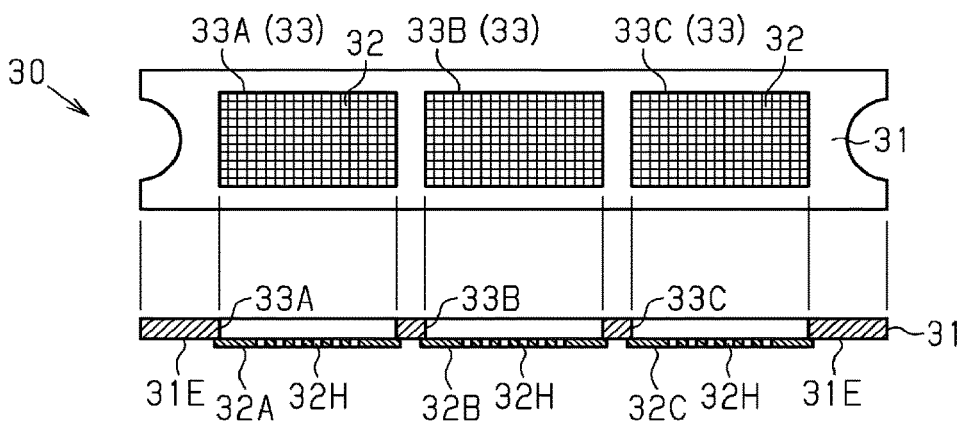
Fig.4A
Fig.4B
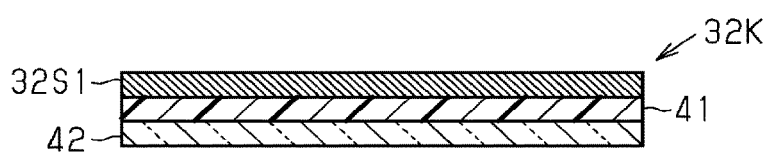
Fig.5A
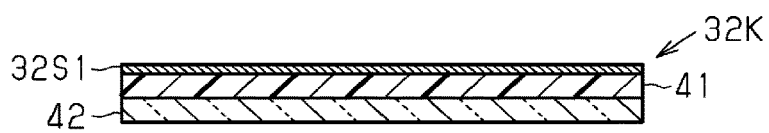
Fig.5B
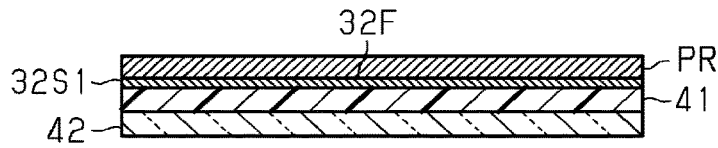
Fig.5C
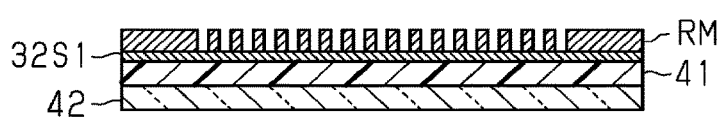
Fig.5D
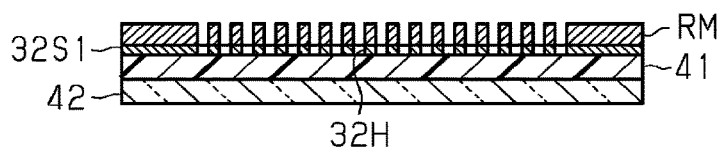
Fig.5E
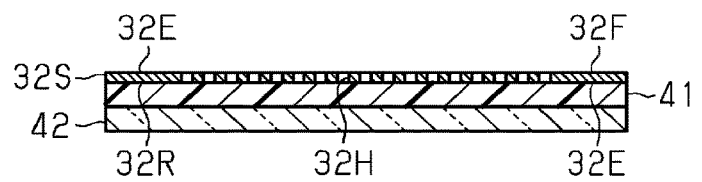
Fig.5F

METHOD FOR MANUFACTURING DEPOSITION MASK, METHOD FOR MANUFACTURING DISPLAY DEVICE AND DEPOSITION MASK

CROSS-REFERENCE

The present application is a continuation application of U.S. application Ser. No. 16/816,181 (U.S. Pat. No. 11,180,843) filed on Mar. 11, 2020, which is a continuation of Application No. PCT/JP2018/034083, filed on Sep. 13, 2018, which claims the benefit and priority to Japanese Application No. JP2017-178223, filed on Sep. 15, 2017.

BACKGROUND

The present disclosure relates to a method for manufacturing a vapor deposition mask, a method for manufacturing a display device, and a vapor deposition mask.

A vapor deposition mask has a contact surface and a non-contact surface. The contact surface is brought into contact with the vapor deposition target, such as a substrate, and the non-contact surface is opposite to the contact surface. The vapor deposition mask has a plurality of mask holes. Each mask hole extends through the vapor deposition mask from the non-contact surface to the contact surface and includes a non-contact opening, which is in the non-contact surface and through which the vapor deposition material enters, and a contact opening, which is in the contact surface and faces the vapor deposition target. The vapor deposition material enters through the non-contact opening and proceeds through the contact opening so as to be deposited on the vapor deposition target. This forms a pattern corresponding to the position and shape of the contact opening on the vapor deposition target (see Japanese Laid-Open Patent Publication No. 2017-145491, for example).

To improve the accuracy of the position and other features of patterns, techniques have been used to manufacture vapor deposition masks in which each mask hole has a passage area that decreases monotonically from the non-contact opening to the contact opening. Further, in recent years, there has been a need for a shorter distance between the non-contact opening and the contact opening, that is, a thinner vapor deposition mask, to improve the uniformity of the film thickness of the pattern.

However, a thinner vapor deposition mask typically fails to have sufficient mechanical durability, considerably increasing the difficulty of handling the vapor deposition mask. Accordingly, there is a strong need for a technique that achieves both the improvement in the accuracy of features of patterns and the improvement in the handleability of vapor deposition masks.

SUMMARY

It is an objective of the present disclosure to provide a method for manufacturing a vapor deposition mask, a method for manufacturing a display device, and a vapor deposition mask that achieve both the improvement in the accuracy of the structure of patterns formed by vapor deposition and the improvement in the handleability of the vapor deposition mask.

To achieve the foregoing objective, a method for manufacturing a vapor deposition mask including a mask portion that is formed from a metal plate made of an iron-nickel alloy and has a plurality of mask holes is provided. The method includes: sandwiching a plastic layer between a glass substrate and a metal plate made of an iron-nickel alloy and joining the metal plate to the glass substrate with the plastic layer in between; forming a mask portion including a plurality of mask holes from the metal plate; joining a surface of the mask portion that is opposite to a surface of the mask portion that is in contact with the plastic layer to a mask frame, which has a higher rigidity than the mask portion and is in a shape of a frame surrounding the mask holes of the mask portion; and peeling off the plastic layer and the glass substrate from the mask portion.

With this configuration, the plastic layer and the glass substrate support the mask portion having a plurality of through-holes in the process of manufacturing the vapor deposition mask. In addition, the mask frame supports the mask portion in the vapor deposition mask. This allows the mask portion to be thinner than that in a configuration in which the vapor deposition mask consists only of the mask portion. Consequently, the shortened distance from one opening to the other of each through-hole improves the accuracy of the structure of the pattern, while the rigidity of the mask frame improves the handleability of the vapor deposition mask.

In the above-described method for manufacturing a vapor deposition mask, peeling off the plastic layer and the glass substrate may include: peeling off the glass substrate from the plastic layer by irradiating an interface between the plastic layer and the glass substrate with a laser beam having a wavelength that passes through the glass substrate and is absorbed by the plastic layer; and peeling off the plastic layer from the mask portion by dissolving the plastic layer using a chemical solution after peeling off the glass substrate from the plastic layer.

This configuration peels off the glass substrate from the plastic layer by irradiation with the laser beam and also peels off the plastic layer from the mask portion by dissolving the plastic layer using a chemical solution. This reduces the external force acting on the mask portion, as compared to a configuration that applies an external force to the laminate of the glass substrate, the plastic layer, and the mask portion to cause interface failure to peel off the glass substrate and the plastic layer from the mask portion. As a result, the peeling of the plastic layer and the glass substrate is less likely to deform the mask portion, and ultimately less likely to deform the through-holes in the mask portion.

In the above-described method for manufacturing a vapor deposition mask, at the wavelength of the laser beam, the glass substrate may have a higher transmittance than the plastic layer.

This configuration increases the efficiency in heating the section of the plastic layer that forms the interface between the glass substrate and the plastic layer, as compared to a configuration in which the plastic layer has a higher transmittance than the glass substrate.

In the above-described method for manufacturing a vapor deposition mask, the wavelength of the laser beam may be between 308 nm and 355 nm inclusive. Also, the transmittance of the glass substrate at the wavelength may be greater than or equal to 54%, and the transmittance of the plastic layer at the wavelength may be less than or equal to 1%.

In this configuration, the glass substrate allows more than half the light quantity of laser beam applied to the glass substrate to pass through, and the plastic layer absorbs most of the laser beam that has passed through the glass substrate. This further increases the efficiency in heating the section of the plastic layer forming the interface between the glass substrate and the plastic layer.

In the above-described method for manufacturing a vapor deposition mask, the mask frame may be made of an iron-nickel alloy, and a ratio of a thickness of the mask frame to a thickness of the mask portion may be greater than or equal to 2.

In this configuration, both of the mask portion and the mask frame are made of an iron-nickel alloy, and the mask frame is at least twice as thick as the mask portion. This enhances the mechanical strength of the vapor deposition mask. Further, when vapor deposition is performed using the vapor deposition mask, the mask portion is unlikely to warp, which would be otherwise caused by a difference in thermal expansion coefficient between the mask frame and the mask portion. This avoids reduction in the accuracy of the shape of pattern formed using the vapor deposition mask.

In the above-described method for manufacturing a vapor deposition mask, the thickness of the mask frame may be between 50 μm and 200 μm inclusive, and the thickness of the mask portion may be between 3 μm and 5 μm inclusive. Also, forming the mask portion may include forming the mask holes such that 700 or more and 1000 or less mask holes are arranged per inch in a direction along a surface of the mask portion.

In this configuration, even when the thickness of the mask portion is extremely thin, the mask frame that is at least ten times thicker than the mask portion avoids reduction in the overall mechanical strength of the vapor deposition mask.

In the above-described method for manufacturing a vapor deposition mask, joining the metal plate to the glass substrate with the plastic layer in between may include joining the metal plate having a thickness of greater than or equal to 10 μm to the glass substrate with the plastic layer in between. The method may further include etching the metal plate before the mask portion is formed from the metal plate to reduce a thickness of the metal plate to half or less of a thickness of the metal plate before etching.

In this configuration, the metal plate has a higher rigidity than the mask portion of the vapor deposition mask. This facilitates the joining of the metal plate to the glass substrate as compared to a configuration in which the metal plate that is joined to the glass substrate has the same thickness as the mask portion.

In the above-described method for manufacturing a vapor deposition mask, the plastic layer may be made of polyimide.

In this configuration, the metal plate, the plastic layer, and the glass substrate have similar thermal expansion coefficients. Consequently, in the process of manufacturing the vapor deposition mask, heating the laminate of the metal plate, the plastic layer, and the glass substrate is unlikely to warp the laminate, which would be otherwise caused by a difference in thermal expansion coefficient between the layers of the laminate.

In the above-described method for manufacturing a vapor deposition mask, the metal plate may include a first surface and a second surface. The method may further include etching the metal plate from the first surface before joining the metal plate to the glass substrate. Also, joining the metal plate to the glass substrate may include joining a surface obtained after the first surface is etched to the glass substrate with the plastic layer in between. The method may further include etching the metal plate from the second surface after the metal plate is joined to the glass substrate.

In this configuration, etching both the first and second surfaces of the metal plate reduces the thickness of the metal plate and also reduces the residual stress of the metal plate.

BRIEF DESCRIPTION OF THE DRAWINGS

FIGS. 4A and 4B are a plan view and a cross-sectional view of the structure of a vapor deposition mask, showing the relationship between the number of mask holes in the vapor deposition mask and the number of mask holes in each mask portion.

FIGS. 5A to 5F are process diagrams for illustrating a method for manufacturing a vapor deposition mask according to one embodiment, each showing one step in the process.

DESCRIPTION OF EXEMPLARY EMBODIMENTS

Referring to FIGS. 1 to 9, embodiments of a method for manufacturing a vapor deposition mask, a method for manufacturing a display device, and a vapor deposition mask are now described. In the following descriptions, the structure of a mask device, the joining structure of the mask portions of the mask device, the number of the mask portions, a method for manufacturing a vapor deposition mask, and test examples are explained in this order.

[Structure of Mask Device]

Figure 1:
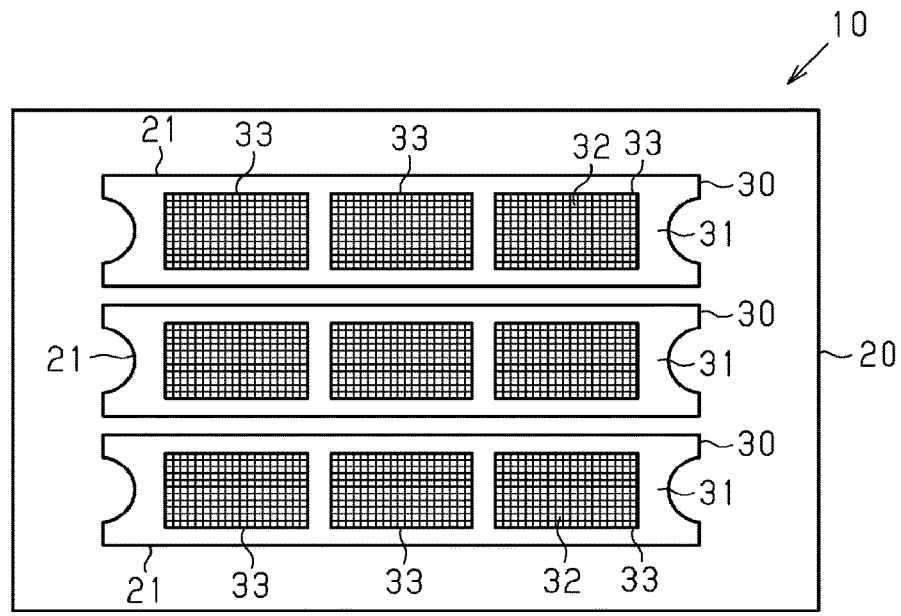
FIG. 1 is a plan view showing the structure of a mask device according to one embodiment.
Figure 2:
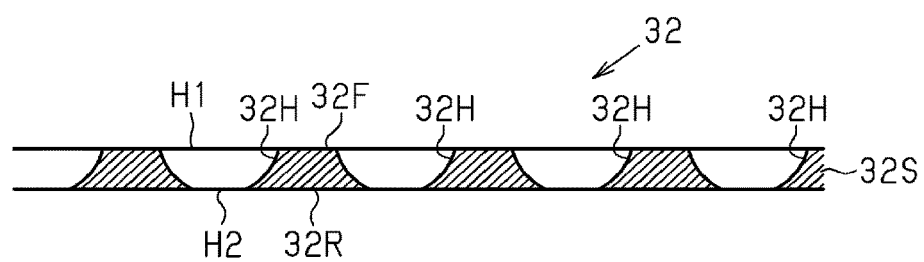
FIG. 2 is a cross-sectional view partially showing the structure of a mask portion.

Referring to FIGS. 1 and 2, the structure of a mask device is now described.

As shown in FIG. 1, a mask device 10 includes a main frame 20 and a plurality of vapor deposition masks 30. The main frame 20 has a rectangular frame shape for supporting the vapor deposition masks 30. The main frame 20 is attached to a vapor deposition apparatus for performing vapor deposition. The main frame 20 has main frame holes 21, which are equal in number to the vapor deposition masks 30. Each main frame hole 21 extends through the main frame 20 in substantially the entire area where a vapor deposition mask 30 is placed.

Each vapor deposition mask 30 includes a mask frame 31 and mask portions 32. Each mask frame 31 has the shape of a planar strip and supports the mask portions 32. The mask frame 31 is attached to the main frame 20. The mask frame 31 has mask frame holes 33, which are equal in number to the mask portions 32. Each mask frame hole 33 extends through the mask frame 31 in substantially the entire area where a mask portion 32 is placed. The mask frame 31 has a higher rigidity than the mask portions 32 and has a frame shape surrounding the mask frame holes 33. The mask frame 31 has inner edge sections defining the mask frame holes 33. The mask portions 32 are fixed to the inner edge sections by welding or adhesion.

As shown in FIG. 2, each mask portion 32 consists of a mask sheet 32S. The mask sheet 32S may be a single metal sheet or a multilayer metal sheet.

The metal sheet forming the mask sheet 32S is made of an iron-nickel alloy. The material of the metal sheet may be an iron-nickel alloy containing at least 30 mass % of nickel. Among iron-nickel alloys, Invar, which is an alloy mainly composed of an alloy containing 36 mass % of nickel and 64 mass % of iron, is preferably used for the metal sheet. When the principal component of the metal sheet is the alloy of 36 mass % of nickel and 64 mass % of iron, the remainder of the metal sheet may contain additives such as chromium, manganese, carbon, and cobalt.

When the mask sheet 32S is an Invar sheet, the mask sheet 32S has a thermal expansion coefficient of about $1.2 \times 10^6/°$C., for example. The mask sheet 32S having such a thermal expansion coefficient allows the degree of thermal expansion of the mask portion 32 to match that of the glass substrate. Thus, a glass substrate may be suitably used as the target of vapor deposition performed using the mask device 10.

The mask sheet 32S includes a mask front surface 32F and a mask back surface 32R, which is opposite to the mask front surface 32F. The mask front surface 32F faces the vapor deposition source in a vapor deposition apparatus. The mask back surface 32R is in contact with the vapor deposition target, such as a glass substrate, in the vapor deposition apparatus. The mask back surface 32R is an example of a contact surface, and the mask front surface 32F is an example of a non-contact surface.

The mask sheet 32S may have a thickness of between 1 μm and 15 μm inclusive. In particular, when the thickness of the mask sheet 32S is less than or equal to 5 μm, mask holes 32H, which are an example of through-holes formed in the mask sheet 32S, can have a depth of less than or equal to 5 μm. Such a thin mask sheet 32S reduces the area in the vapor deposition target that is hidden by the vapor deposition mask 30 as viewed from the vapor deposition particles traveling toward the mask sheet 32S, in other words, reduces the shadow effect.

The mask sheet 32S having a thickness of between 3 μm and 5 μm inclusive can have mask holes 32H that are spaced apart from one another in a plan view of the mask front surface 32F and usable to manufacture a high-resolution display device having a resolution of between 700 ppi and 1000 ppi inclusive. The mask sheet 32S having a thickness of between 10 μm and 15 μm inclusive can have mask holes 32H that are spaced apart from one another in a plan view of the mask front surface 32F and usable to manufacture a low-resolution display device having a resolution of between 300 ppi and 400 ppi inclusive.

Each mask portion 32 has a plurality of mask holes 32H extending through the mask sheet 32S. The hole side surface defining each mask hole 32H is semicircular and curved outward of the mask hole 32H as viewed in a cross-section along the thickness direction of the mask sheet 32S.

The mask front surface 32F includes front surface openings H1, which are openings of the mask holes 32H. The mask back surface 32R includes back surface openings H2, which are openings of the mask holes 32H. Each front surface opening H1 is an example of a first opening, and each back surface opening H2 is an example of a second opening. In a plan view of the mask front surface 32F, the front surface opening H1 is larger in size than the back surface opening H2. Each mask hole 32H is a passage for the vapor deposition particles sublimated from the vapor deposition source. The vapor deposition particles sublimated from the vapor deposition source travel in the mask hole 32H from the front surface opening H1 toward the back surface opening H2. The mask hole 32H having the front surface opening H1 that is larger than the back surface opening H2 reduces the shadow effect for the vapor deposition particles entering through the front surface opening H1.

In the mask front surface 32F, each front surface opening H1 is spaced apart from the other front surface openings H1. In other words, in the mask front surface 32F, each front surface opening H1 is not connected to the other front surface openings H1. Thus, in a plan view of the mask front surface 32F, the sections of the mask portion 32 located between the front surface openings H1 are unlikely to be thinner than the section of the mask portion 32 that is free of mask holes 32H. This avoids reduction in mechanical strength of the mask portion 32. If one front surface opening H1 is connected to another front surface opening H1 in the mask front surface 32F, the section where the two front surface openings H1 overlap would be thinner than the section of the mask portion 32 that is free of mask holes 32H. This reduces the mechanical strength of the mask portion 32 as compared to the configuration in which each front surface opening H1 is spaced apart from the other front surface openings H1.

When the mask portion 32 has a thickness of between 3 μm and 5 μm inclusive, mask holes 32H that are usable to manufacture a high-resolution display device as described above can be formed simply by wet-etching the mask sheet 32S from the mask front surface 32F. Further, when the mask portion 32 has a thickness of between 10 μm and 15 μm inclusive, mask holes 32H that are usable to manufacture a low-resolution display device as described above can be formed simply by wet-etching the mask sheet 32S from the mask front surface 32F. That is, in either case, it is not necessary to wet-etch the mask sheet 32S from the mask back surface 32R.

In contrast, if a thicker mask sheet 32S is used to form a vapor deposition mask 30 for the manufacturing of a display device having a certain resolution, this mask sheet 32S needs to be wet-etched from both the mask front surface 32F and the mask back surface 32R. When the mask sheet 32S is wet-etched from both the mask front surface 32F and the mask back surface 32R, each mask hole 32H has a shape in which a front surface recess, which includes a front surface opening H1, and a back surface recess, which includes the back surface opening H2, are connected to each other at the center of the mask portion 32 in the thickness direction. In each mask hole 32H, a section where the front surface recess is connected to the back surface recess is referred to as a connection section. The area of the mask hole 32H along the direction parallel to the mask front surface 32F is smallest in the connection section. The distance between the connection section and the back surface opening H2 in the mask hole 32H is referred to as a step height. A greater step height increases the shadow effect described above. In contrast, the mask portion 32 described above has zero step height. As such, the mask portion 32 advantageously limits the shadow effect.

[Mask Portion Joining Structure]

Figure 3:
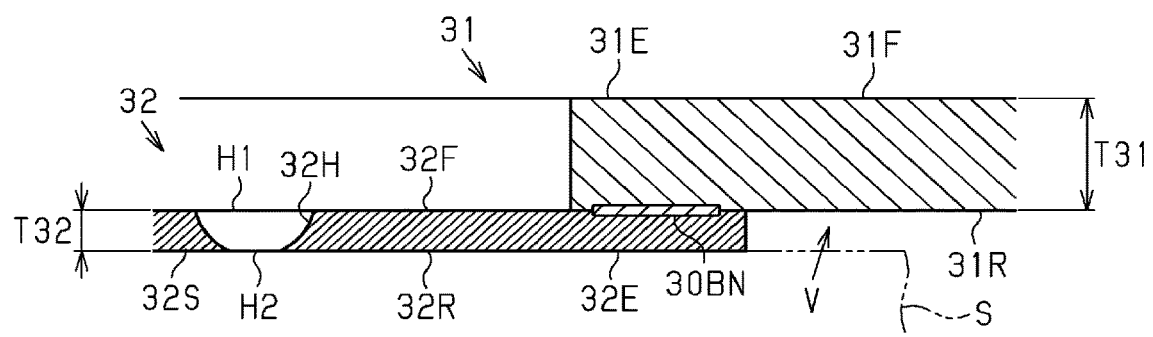
FIG. 3 is a cross-sectional view partially showing the joining structure between an edge of a mask portion and a mask frame.

Referring to FIG. 3, the cross-sectional structure of the joining between a mask portion 32 and a mask frame 31 is now described.

As shown in FIG. 3, each mask sheet 32S has an outer edge section 32E, which includes the edge of the mask sheet 32S. The outer edge section 32E of the mask sheet 32S includes a region that is free of mask holes 32H and extends continuously along the edge of the mask sheet 32S. The mask front surface 32F of the outer edge section 32E is joined to the mask frame 31.

The mask frame 31 includes inner edge sections 31E, which define mask frame holes 33, a frame back surface 31R, which faces the mask sheet 32S, and a frame front surface 31F, which is opposite to the frame back surface 31R. Each inner edge section 31E includes a part of the frame back surface 31R and a part of the frame front surface 31F. The thickness T31 of the mask frame 31, that is, the distance between the frame back surface 31R and the frame front surface 31F, is greater than the thickness T32 of the mask sheet 32S. This allows the mask frame 31 to have a higher rigidity than the mask sheet 32S. In particular, the mask frame 31 has a high rigidity that limits sagging of the inner edge section 31E by its own weight and displacement of the inner edge section 31E toward the mask portion 32.

The mask frame 31 is preferably made of an iron-nickel alloy, more preferably an iron-nickel alloy that is used as the principal component of the mask sheet 32S. That is, the mask frame 31 is preferably made of Invar. The mask frame 31 is preferably at least twice as thick as the mask portion 32.

The frame back surface 31R of each inner edge section 31E has a joining section 30BN where the mask front surface 32F is joined to the mask frame 31. The joining section 30BN extends continuously or intermittently along substantially the entire circumference of the inner edge section 31E. The joining section 30BN may be a welding mark formed by welding the frame back surface 31R to the mask front surface 32F. Alternatively, the joining section 30BN may be a joining layer that is formed separately from the mask frame 31 and the mask portion 32 to join the frame back surface 31R to the mask front surface 32F.

When each mask frame 31 is joined to the main frame 20, the main frame 20 applies stress to the mask frame 31 that pulls the mask frame 31 outward. In this step, the mask frame 31 may be joined to the main frame 20 such that the ends of the mask frame 31 in the extending direction extend outward beyond the main frame 20.

The frame back surface 31R is a plane including the joining section 30BN and extends outward of the mask sheet 32S from the mask front surface 32F of the outer edge section 32E. In other words, the inner edge section 31E has a planar structure that virtually extends the mask front surface 32F outward, so that the inner edge section 31E extends from the mask front surface 32F of the outer edge section 32E toward the outside of the mask sheet 32S. Accordingly, in the area in which the frame back surface 31R extends outward beyond the mask sheet 32S, a space V, which corresponds to the thickness of the mask sheet 32S, is likely to be created around the mask sheet 32S. This limits physical interference between the vapor deposition target S and the mask frame 31 around the mask sheet 32S.

[Number of Mask Portions]

With reference to FIG. 4, the relationship between the number of mask holes 32H in a vapor deposition mask 30 and the number of mask holes 32H in a mask portion 32 is now described.

As shown in FIG. 4A, each mask frame 31 may include three mask frame holes 33, which are an example of a plurality of mask frame holes 33. As shown in FIG. 4B, each vapor deposition mask 30 includes one mask portion 32 for each mask frame hole 33.

Specifically, the inner edge section 31E defining a first mask frame hole 33A is joined to a first mask portion 32A. The inner edge section 31E defining a second mask frame hole 33B is joined to a second mask portion 32B. The inner edge section 31E defining a third mask frame hole 33C is joined to a third mask portion 32C.

The vapor deposition mask 30 is used repeatedly for a plurality of vapor deposition targets. Thus, the position and structure of the mask holes 32H in the vapor deposition mask 30 need to be highly accurate. When the number of mask holes 32H required in one mask frame 31 is divided into three mask portions 32 as described above, the following advantages are achieved. That is, in case one of the mask portions 32 is partially deformed, the size of a new mask portion 32 for replacing the deformed mask portion 32 may be reduced, as compared to a structure in which all the mask holes 32H are formed in one mask portion 32. In addition, the consumption of various materials associated with the manufacturing and repair of the vapor deposition mask 30 may be lowered.

The structure of the mask holes 32H is inspected preferably while the mask portions 32 are joined to the mask frame 31. For this reason, the joining section 30BN preferably has a configuration that allows for replacement of a deformed mask portion 32 with a new mask portion 32. Thus, one mask frame 31 can be used for a plurality of mask portions 32, and different mask portions 32 can be inspected using one mask frame 31. In addition, a thinner mask sheet 32S of the mask portion 32 and smaller mask holes 32H tend to reduce the yield of the mask portion 32. Thus, the structure in which each of the mask frame holes 33 has one mask portion 32 is particularly suitable for a vapor deposition mask that requires a high definition.

In the mask frame 31, the mask frame holes 33 form a mask hole row. The mask frame 31 is not limited to the configuration with one mask hole row and may include a plurality of mask hole rows. That is, the vapor deposition mask 30 may include a plurality of rows of mask portions 32.

[Method for Manufacturing Vapor Deposition Mask]

Referring to FIGS. 5 and 6, a method for manufacturing the vapor deposition mask is now described. FIG. 5 shows the step of preparing a substrate for producing mask portions 32 to the step of producing the mask portions 32. FIG. 6 shows the step of joining the mask portions 32 to the mask frame 31 to the step of removing the plastic layer from the mask portions 32.

As shown in FIGS. 5A to 5F, the method for manufacturing the vapor deposition mask 30 first prepares a substrate 32K of a mask sheet 32S (see FIG. 5A). The substrate 32K of the mask sheet 32S includes a metal sheet 32S1, which is an example of a metal plate for forming a mask sheet 32S, and also a plastic layer 41 and a glass substrate 42, which support the metal sheet 32S1. Then, the thickness of the metal sheet 32S1 is reduced (see FIG. 5B). The thickness of the metal sheet 32S1 is preferably reduced to half or less the thickness of the metal sheet 32S1 before etching. A resist layer PR is formed on the mask front surface 32F of the metal sheet 32S1 (see FIG. 5C). The resist layer PR is then exposed and developed, thereby forming a resist mask RM on the mask front surface 32F (see FIG. 5D).

Then, the mask front surface 32F of the metal sheet 32S1 is wet-etched using the resist mask RM, forming a plurality of mask holes 32H in the metal sheet 32S1 (see FIG. 5E). In the wet etching of the metal sheet 32S1, front surface openings H1 are first formed in the mask front surface 32F, and back surface openings H2, which are smaller in size than the front surface openings H1, are then formed in the mask back surface 32R. Then, the resist mask RM is removed from the mask front surface 32F, completing a mask portion 32 formed of the mask sheet 32S (see FIG. 5F).

The step of preparing the substrate 32K includes a first joining step. The first joining step sandwiches the plastic layer 41 between the metal sheet 32S1 and the glass substrate 42 and joins the metal sheet 32S1 to the glass substrate 42 with the plastic layer 41 in between. To join the metal sheet 32S1, the plastic layer 41, and the glass substrate 42 together, a chemical bonding (CB) process is first applied to the surfaces of the metal sheet 32S1 and the glass substrate 42 that are brought into contact at least with the plastic layer 41. The surfaces of the metal sheet 32S1 and the glass substrate 42 that are subjected to the CB process are target surfaces. In the CB process, a chemical solution may be applied to the target surfaces to provide the target surfaces with a functional group reactive with the plastic layer 41. For example, the CB process applies a hydroxyl group to the target surfaces. The metal sheet 32S1, the plastic layer 41, and the glass substrate 42 are layered in this order and subjected to thermocompression bonding. The functional group on the target surfaces reacts with the functional group on the surfaces of the plastic layer 41, thereby bonding the plastic layer 41 to the metal sheet 32S1 and to the glass substrate 42. In the first joining step, the metal sheet 32S1 that is joined to the glass substrate 42 with the plastic layer 41 in between preferably has a thickness of greater than or equal to 10 μm.

The plastic layer 41 is preferably made of polyimide. This allows the metal sheet 32S1, the plastic layer 41, and the glass substrate 42 to have similar thermal expansion coefficients. Consequently, in the process of manufacturing the vapor deposition mask 30, the laminate of the metal sheet 32S1, the plastic layer 41, and the glass substrate 42 is unlikely to warp when heated, which would be otherwise caused by a difference in thermal expansion coefficient between the layers of the laminate.

Electrolysis or rolling is used to produce the metal sheet 32S1. The metal sheet 32S1 obtained by electrolysis or rolling may be subjected to post-treatment, such as polishing or annealing.

When electrolysis is used to produce the metal sheet 32S1, the metal sheet 32S1 is formed on the surface of the electrode used for electrolysis. The metal sheet 32S1 is then removed from the surface of the electrode. The metal sheet 32S1 is thus produced.

When rolling is used to produce the metal sheet 32S1, the metal sheet 32S1 preferably has a thickness of greater than or equal to 15 μm. When electrolysis is used to produce the metal sheet 32S1, the metal sheet 32S1 preferably has a thickness of greater than or equal to 10 μm The electrolytic bath for electrolysis contains an iron ion source, a nickel ion source, and a pH buffer. The electrolytic bath may also contain a stress relief agent, an $Fe^{3+}$ ion masking agent, and a complexing agent, for example. The electrolytic bath is a weakly acidic solution having a pH adjusted for electrolysis. Examples of the iron ion source include ferrous sulfate heptahydrate, ferrous chloride, and ferrous sulfamate. Examples of the nickel ion source include nickel (II) sulfate, nickel (II) chloride, nickel sulfamate, and nickel bromide. Examples of the pH buffer include boric acid and malonic acid. Malonic acid also functions as an $Fe^{3+}$ ion masking agent. The stress relief agent may be saccharin sodium, for example. The complexing agent may be malic acid or citric acid. The electrolytic bath used for electrolysis may be an aqueous solution containing additives listed above. The electrolytic bath is adjusted using a pH adjusting agent to have a pH of between 2 and 3 inclusive, for example. The pH adjusting agent may be 5% sulfuric acid or nickel carbonate.

The conditions for electrolysis are set to achieve desired values of thickness and composition ratio of the metal sheet 32S1. These conditions include the temperature of the electrolytic bath, the current density, and the electrolysis time. The temperature of the electrolytic bath may be between 40° C. and 60° C. inclusive. The current density may be between 1 $A/dm^2$ and 4 $A/dm^2$ inclusive. The anode used in the electrolytic bath may be a pure iron plate or a nickel plate, for example. The cathode used in the electrolytic bath may be a plate of stainless steel such as SUS304.

When rolling is used to produce the metal sheet 32S1, a base material for manufacturing the metal sheet 32S1 is first rolled. The rolled base material is annealed to obtain the metal sheet 32S1. When the base material, which is to be rolled to form the metal sheet 32S1, is formed, a deoxidizer is mixed into the constituents of the base material for rolling so as to remove the oxygen trapped in the constituents. The deoxidizer may be granular aluminum or magnesium. The aluminum or magnesium reacts with the oxygen in the base material and is contained in the base material as a metallic oxide such as an aluminum oxide or a magnesium oxide. While most of the metallic oxide is removed from the base material before rolling, some of the metallic oxide remains in the base material to be rolled. In this respect, a method for manufacturing the mask portion 32 using electrolysis limits mixing of the metallic oxide into the mask sheet 32S.

The thinning step etches the metal sheet 32S1 to reduce the thickness of the metal sheet 32S1 before the metal sheet 32S1 forms the mask portion 32. The thinning step may use wet etching. The thinning step preferably reduces the thickness of the metal sheet 32S1 to half or less the thickness of the metal sheet 32S1 before thinning. This allows the metal sheet 32S1 used in the first joining step to be at least twice as thick as the mask portion 32. Thus, even when the mask portion 32 is required to have a thickness of less than or equal to 15 μm as described above, the metal sheet 32S1 that has a higher rigidity than the mask portion 32 of the vapor deposition mask 30 is used before the metal sheet 32S1 is joined to the glass substrate 42 in the first joining step. This facilitates the joining of the metal sheet 32S1 to the glass substrate 42 as compared to a configuration in which the metal sheet 32S1 that is joined to the glass substrate 42 has the same thickness as the mask portion 32. The step of reducing the thickness of the metal sheet 32S1 may be omitted.

In the thinning step, any acidic etchant may be used as the etchant for wet-etching the metal sheet 32S1. When the metal sheet 32S1 is made of Invar, any etchant can be used that is capable of etching Invar. The acidic etchant may be a solution containing perchloric acid, hydrochloric acid, sulfuric acid, formic acid, or acetic acid mixed in a ferric perchlorate solution or a mixture of a ferric perchlorate solution and a ferric chloride solution. The metal sheet 32S1 may be etched by a dipping method, a spraying method, or a spinning method.

An acidic etchant may be used to form a plurality of mask holes 32H in the metal sheet 32S1 by etching. When the metal sheet 32S1 is made of Invar, any of the etchants that are usable in the thinning step described above can be used.

In addition, any of the methods usable in the thinning step may be used to etch the mask front surface 32F.

As described above, when the thickness of the metal sheet 32S1 is between 3 μm and 5 μm inclusive, a plurality of mask holes 32H may be formed such that 700 or more and 1000 or less mask holes 32H are arranged per inch in a plan view of the mask front surface 32F of the metal sheet 32S1. That is, a mask portion 32 is obtained that can be used to form a display device having a resolution of between 700 ppi and 1000 ppi inclusive. In other words, a plurality of mask holes 32H can be formed such that 700 or more and 1000 or less mask holes 32H are arranged per inch in the direction along the mask front surface 32F of the mask portion 32.

Further, when the thickness of the metal sheet 32S1 is between 10 μm and 15 μm inclusive, a plurality of mask holes 32H may be formed such that 300 or more and 400 or less mask holes 32H are arranged per inch in a plan view of the mask front surface 32F of the metal sheet 32S1. That is, a mask portion 32 is obtained that can be used to form a display device having a resolution of 300 ppi to 400 ppi inclusive. In other words, a plurality of mask holes 32H can be formed such that 300 or more and 400 or less mask holes 32H are arranged per inch in the direction along the mask front surface 32F of the mask portion 32.

The step of preparing the substrate 32K may include a step of thinning the metal sheet 32S1 from one surface of the metal sheet 32S1 before the first joining step. In this case, the thinning step included in the step of preparing the substrate 32K is a first thinning step, and the thinning step performed after the step of preparing the substrate 32K is a second thinning step.

The metal sheet 32S1 includes a first surface and a second surface, which is opposite to the first surface. In the first thinning step, the metal sheet 32S1 is thinned by etching on the first surface. In the second thinning step, the metal sheet 32S1 is thinned by etching on the second surface. The surface formed by etching on the first surface is the surface of the metal sheet 32S1 that is joined to the plastic layer 41 and also subjected to the CB process.

Etching both the first and second surfaces of the metal sheet 32S1 allows the residual stress of the metal sheet 32S1 to be adjusted from both the first and second surfaces. This limits imbalance in the residual stress of the metal sheet 32S1 after etching, as compared to a configuration that etches only the second surface. Consequently, when the mask portion 32 obtained from the metal sheet 32S1 is joined to the mask frame 31, the mask portion 32 is less likely to have creases. The surface of the metal sheet 32S1 that is obtained by etching the first surface corresponds to the mask back surface 32R of the mask sheet 32S, and the surface obtained by etching the second surface corresponds to the mask front surface 32F of the mask sheet 32S.

The amount of etching on the first surface of the metal sheet 32S1 is a first etching amount, and the amount of etching on the second surface of the metal sheet 32S1 is a second etching amount. The first etching amount and the second etching amount may be the same or different. When the first etching amount differs from the second etching amount, the first etching amount may be larger than the second etching amount, or the second etching amount may be larger than the first etching amount. When the second etching amount is larger than the first etching amount, the amount of etching performed while the metal sheet 32S1 is supported by the plastic layer 41 and the glass substrate 42 is larger, increasing the handleability of the metal sheet 32S1. This facilitates the etching of the metal sheet 32S1.

In order to reduce the residual stress of the metal sheet 32S1 and to reduce the metallic oxide contained in the metal sheet 32S1 obtained by rolling, the first etching amount and the second etching amount are preferably greater than or equal to 3 μm.

Figure 6A:
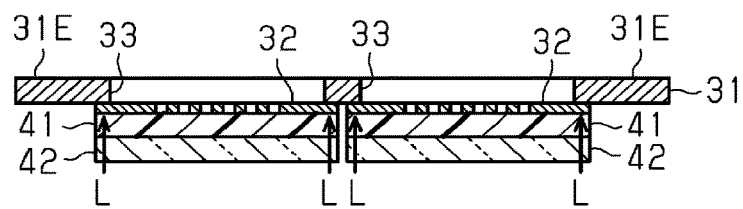
FIGS. 6A to 6C are process diagrams for illustrating a method for manufacturing a vapor deposition mask according to one embodiment, each showing one step in the process.
Figure 6B:
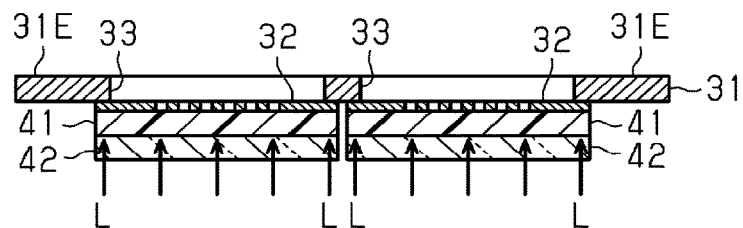
Figure 6C:
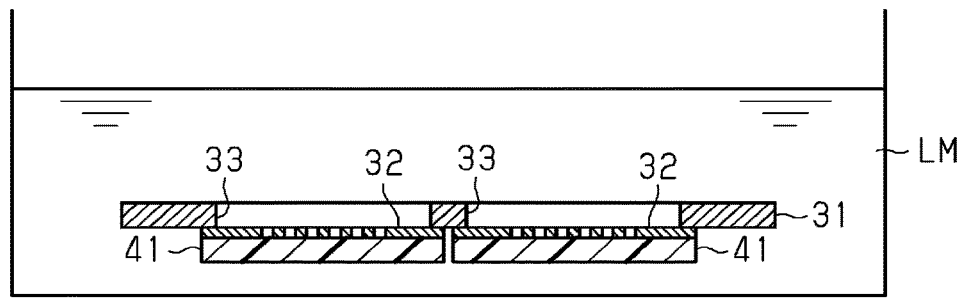

As shown in FIGS. 6A to 6C, the mask front surfaces 32F of the outer edge sections 32E are joined to the inner edge sections 31E (see FIG. 6A). Then, the glass substrates 42 joined to the respective plastic layers 41 are peeled off from the plastic layers 41 (see FIG. 6B). The plastic layers 41 joined to the respective mask portions 32 are then peeled off from the mask portions 32 (see FIG. 6C). The vapor deposition mask 30 is thus obtained.

The step of joining a part of each mask portion 32 to a part of the mask frame 31 includes a second joining step. The second joining step joins the mask frame 31 to the surface of the mask portion 32 opposite to the surface that is in contact with the plastic layer 41. As described above, the mask frame 31 is preferably made of an iron-nickel alloy, and the mask frame 31 is preferably at least twice as thick as the mask portion 32. This enhances the mechanical strength of the vapor deposition mask 30. Further, when vapor deposition is performed using the vapor deposition mask 30, the mask portion 32 is unlikely to warp, which would be otherwise caused by a difference in thermal expansion coefficient between the mask frame 31 and the mask portion 32. This avoids reduction in the accuracy of the shape of pattern formed using the vapor deposition mask 30.

As described above, when the thickness of the mask portion 32 is between 3 μm and 15 μm inclusive, the thickness of the mask frame 31 is preferably between 15 μm and 200 μm inclusive, and the mask frame 31 is preferably at least twice as thick as the mask portion 32. For the vapor deposition mask 30 including the mask portions 32 usable to manufacture high-resolution display devices, the thickness of each mask frame 31 is preferably at least ten times thicker than the mask portion 32. For example, the thickness of the mask portion 32 is preferably between 3 μm and 5 μm inclusive, and the thickness of the mask frame 31 is preferably between 50 μm and 200 μm inclusive. Although the mask portion 32 is extremely thin, the mask frame 31 that is at least ten times thicker than the mask portion 32 avoids reduction in the overall mechanical strength of the vapor deposition mask 30.

As described above, laser welding can be used to join the outer edge section 32E to the inner edge section 31E. The section of the mask portion 32 corresponding to the joining section 30BN is irradiated with a laser beam L through the glass substrate 42 and the plastic layer 41. As such, the glass substrate 42 and the plastic layer 41 allow the laser beam L to pass through. In other words, the laser beam L has a wavelength that can pass through the glass substrate 42 and the plastic layer 41. Intermittent joining sections 30BN are formed by applying the laser beam L intermittently along the edge defining the mask frame hole 33. A continuous joining section 30BN is formed by applying the laser beam L continuously along the edge defining the mask frame hole 33. The outer edge section 32E is thus welded to the inner edge section 31E. When the plastic layer 41 and the glass substrate 42 support the mask portion 32 with stress acting on the mask portion 32 outward of the mask portion 32, the welding between the mask portion 32 and the mask frame 31 does not have to involve application of stress to the mask portion 32.

The method for manufacturing the vapor deposition mask 30 includes a peeling step. The peeling step peels off the plastic layer 41 and the glass substrate 42 from the mask portion 32. In the process of manufacturing the vapor deposition mask 30, the plastic layer 41 and the glass substrate 42 support the mask portion 32 including the mask holes 32H. In the vapor deposition mask 30, the mask frame 31 supports the mask portion 32. This allows the mask portion 32 to be thinner than that in a configuration in which the vapor deposition mask 30 consists only of the mask portion 32. Accordingly, the shortened distance from one opening to the other of each mask hole 32H improves the accuracy of the structure of the pattern formed using the vapor deposition mask 30, while the rigidity of the mask frame 31 improves the handleability of the vapor deposition mask 30.

The peeling step includes a first peeling step and a second peeling step. The first peeling step peels off the glass substrate 42 from the plastic layer 41 by irradiating the interface between the plastic layer 41 and the glass substrate 42 with the laser beam L having a wavelength that passes through the glass substrate 42 and is absorbed by the plastic layer 41.

The first peeling step applies the laser beam L to the interface between the plastic layer 41 and the glass substrate 42 so that the plastic layer 41 absorbs the heat energy of the laser beam L. This heats the plastic layer 41 and weakens the strength of the chemical bonding between the plastic layer 41 and the glass substrate 42. The glass substrate 42 is then peeled off from the plastic layer 41. In the first peeling step, the entire joining section 30BN is preferably irradiated with the laser beam L. However, only a part of the joining section 30BN may be irradiated with the laser beam L if the strength of bonding between the glass substrate 42 and the plastic layer 41 is weakened in the entire joining section 30BN.

The glass substrate 42 preferably has a higher transmittance than the plastic layer 41 at the wavelength of the laser beam L. This increases the efficiency in heating the section of the plastic layer 41 that forms the interface between the glass substrate 42 and the plastic layer 41, as compared to a configuration in which the plastic layer 41 has a higher transmittance than the glass substrate 42.

When the wavelength of the laser beam L is between 308 nm and 355 nm inclusive, for example, the glass substrate 42 preferably has a transmittance of greater than or equal to 54%, and the plastic layer 41 preferably has a transmittance of less than or equal to 1% at this wavelength. As a result, more than half the light quantity of laser beam L applied to the glass substrate 42 passes through the glass substrate 42, and the plastic layer 41 absorbs most of the laser beam L that has passed through the glass substrate 42. This further increases the efficiency in heating the section of the plastic layer 41 forming the interface between the glass substrate 42 and the plastic layer 41.

As described above, the plastic layer 41 is preferably made of polyimide. In particular, the plastic layer 41 is preferably made of a colored polyimide. The glass substrate 42 is preferably transparent. Examples of the material used for the glass substrate 42 include quartz glass, non-alkali glass, and soda-lime glass.

After the first peeling step, the second peeling step peels off the plastic layer 41 from the mask portion 32 by dissolving the plastic layer 41 using a chemical solution LM. As the chemical solution LM, a liquid may be used that can dissolve the material of the plastic layer 41 and that is not reactive with the material of the mask portion 32. The chemical solution LM may be an alkaline solution, for example. The alkaline solution may be an aqueous sodium hydroxide solution. The example shown in FIG. 6C uses a dipping method to bring the plastic layer 41 into contact with the chemical solution LM. However, a spraying method and a spinning method may be used to bring the plastic layer 41 into contact with the chemical solution LM.

In the process of peeling off the plastic layer 41 and the glass substrate 42 from the mask portion 32, the first peeling step peels off the glass substrate 42 from the plastic layer 41, and the second peeling step peels off the plastic layer 41 from the mask portion 32. This reduces the external force acting on the mask portion 32, as compared to a configuration that applies external force to the laminate of the glass substrate 42, the plastic layer 41, and the mask portion 32 to cause interface failure to peel off the glass substrate 42 and the plastic layer 41 from the mask portion 32. As a result, the peeling of the plastic layer 41 and the glass substrate 42 is less likely to deform the mask portion 32, and ultimately less likely to deform the mask holes 32H in the mask portion 32.

In the method of manufacturing a display device using the vapor deposition mask described above, the mask device 10 in which the vapor deposition mask 30 is set is placed in a vacuum chamber of the vapor deposition apparatus. At this time, the mask device 10 is set in the vacuum chamber such that the mask back surface 32R faces the vapor deposition target, such as a glass substrate, and that the mask front surface 32F faces the vapor deposition source. Then, the vapor deposition target S is placed in the vacuum chamber, and the vapor deposition material is sublimated from the vapor deposition source. This forms a pattern of the shape corresponding to the back surface opening H2 on the vapor deposition target facing the back surface opening H2. The vapor deposition material may be an organic light-emitting material for forming pixels of a display device, or a material of a pixel electrode for forming a pixel circuit of a display device, for example.

Test Examples

Figure 7:
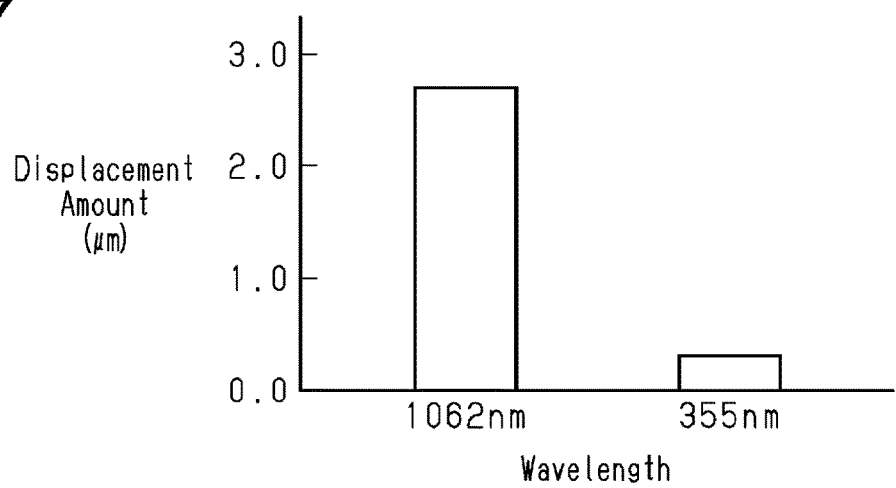
FIG. 7 is a graph showing the relationship between the wavelength of a laser beam and the amount of displacement in test examples.
Figure 8:
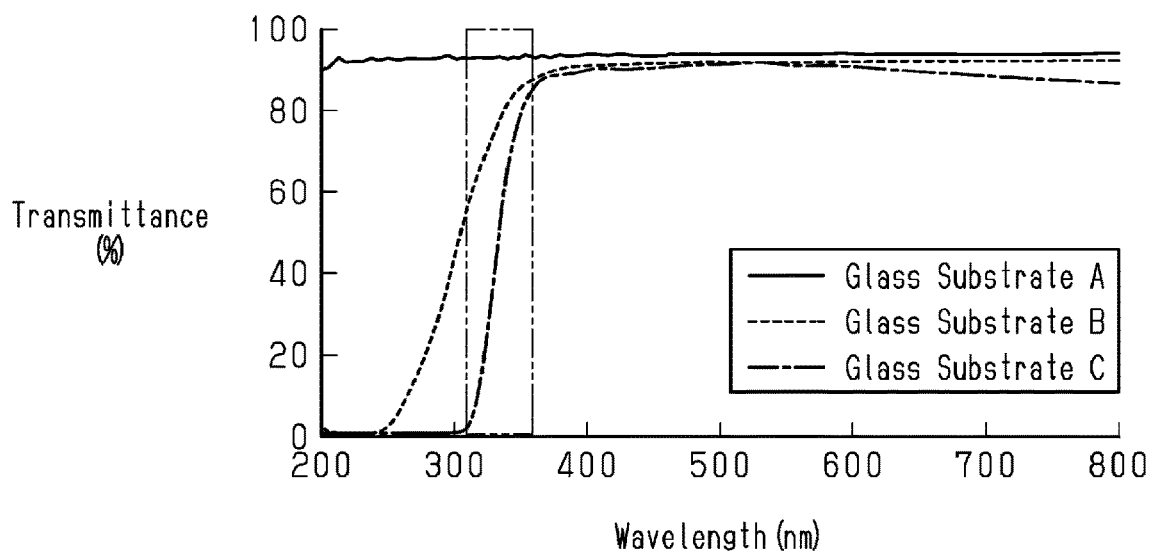
FIG. 8 is a graph showing the relationship between the wavelength of light and the transmittance of each glass substrate in test examples.
Figure 9:
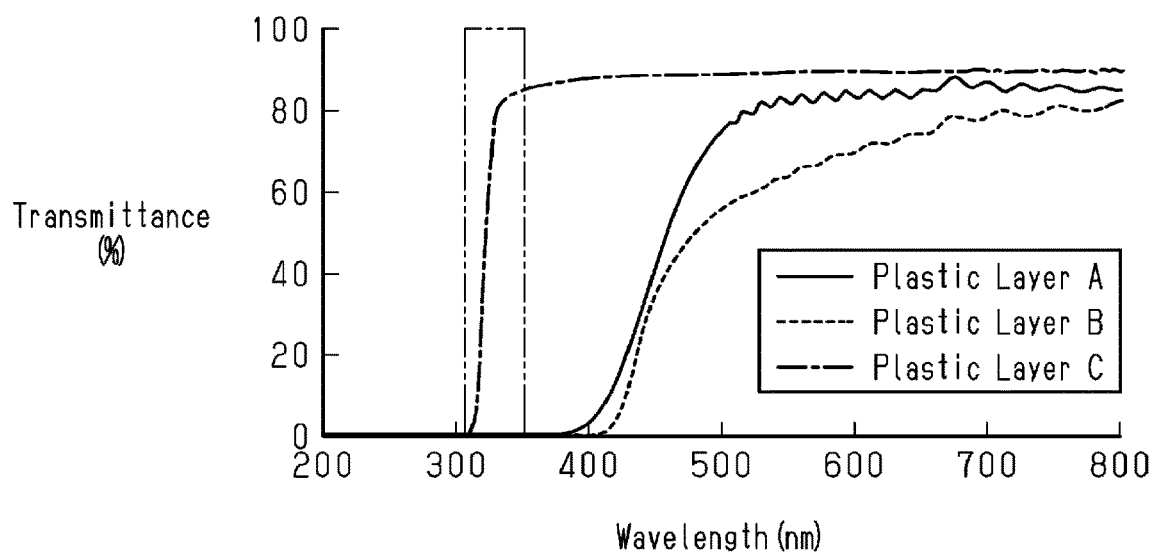
FIG. 9 is a graph showing the relationship between the wavelength of light and the transmittance of each plastic layer in test examples.

Referring to FIGS. 7 to 9, test examples are now described. In FIGS. 8 and 9, each region surrounded by the long dashed double-short dashed line is a wavelength band of between 308 nm and 355 nm inclusive.

[Relationship Between Laser Beam Wavelength and Pattern Position]

First, test plates, which were thin metal plates, were prepared. Each test plate had a central section and an outer section surrounding the central section. In the test plate, the central section had a plurality of patterns for measurement of the positional accuracy, and the outer section was free of a pattern. As the lasers to apply laser beams to test plates, a laser emitting a laser beam having a wavelength of 1064 nm and a laser emitting a laser beam having a wavelength of 355 nm were prepared.

Each laser emitted a laser beam to the outer section of each test plate along one straight line. By applying a laser beam, a plurality of irradiated sections each having a length of 0.1 mm were formed at intervals of 0.5 mm. For each test plate, the state before laser beam irradiation and the state after laser beam irradiation were photographed using a CNC image measuring system (VMR-6555, manufactured by Nikon Corporation). The amount of displacement of the pattern closest to the outer section between the test plate before irradiation and the test plate after irradiation was determined.

As shown in FIG. 7, when a test plate was irradiated with a laser beam of 1062 nm, the amount of displacement was 2.7 μm. When a test plate was irradiated with a laser beam of 355 nm, the amount of displacement was 0.27 μm.

The first peeling step directs a laser beam toward the mask portion through the glass substrate and the plastic layer. As such, the glass substrate and the plastic layer absorb most of the laser beam directed toward the mask portion. Nevertheless, the laser beam directed toward the mask portion should not displace the pattern of the mask portion in case the mask portion is irradiated with the laser beam. For this reason, the laser beam used in the first peeling step preferably has a wavelength of less than or equal to 355 nm.

[Transmittance of Glass Substrate and Plastic Layer]

Glass substrates A, B and C were prepared, and their transmittance at each wavelength was measured. Glass substrate A was a quartz glass substrate having a thickness of 2.3 mm (SMS6009E5, manufactured by Shin-Etsu Chemical Co., Ltd.). Glass substrate B was a non-alkali glass substrate having a thickness of 0.7 mm (OA-10G, manufactured by Nippon Electric Glass Co., Ltd.). Glass substrate C was a substrate made of soda-lime glass having a thickness of 2.3 mm (soda-lime glass, manufactured by Central Glass Co., Ltd.).

The transmittance of each glass substrate was measured using a spectrophotometer (U-4100, manufactured by Hitachi, Ltd.). The transmittances of the glass substrates were measured using a wavelength range of between 200 nm and 800 nm inclusive and using the transmittances in the atmosphere as reference values. FIG. 8 shows the measurement results of the transmittances of the glass substrates.

As shown in FIG. 8, the transmittance of Glass substrate A was observed to be substantially constant regardless of the wavelength of light. The transmittance of Glass substrate B was observed to rise sharply in a wavelength band of between 250 nm and 350 nm inclusive. The transmittance of Glass substrate C was observed to rise sharply in a wavelength band of between 300 nm and 350 nm inclusive.

Plastic layers A, B and C were prepared, and their transmittance at each wavelength was measured. Plastic layer A was a colored polyimide plastic layer (Kapton (registered trademark) EN, manufactured by DU PONT-TORAY CO., LTD.). Plastic layer B was a colored polyimide plastic layer (Upilex (registered trademark) VT, manufactured by Ube Industries, Ltd.). Plastic layer C was a transparent polyimide plastic layer (Neoprim (registered trademark), manufactured by MITSUBISHI GAS CHEMICAL COMPANY, INC.). All the plastic layers had a thickness of 25 µm.

The transmittance of each plastic layer was measured using a spectrophotometer (same as above). In the same manner as the glass substrates, the transmittances of the plastic layers were measured using a wavelength range of between 200 nm and 800 nm inclusive and using the transmittances in the atmosphere as reference values. FIG. 9 shows the measurement results of the transmittances of the plastic layers.

As shown in FIG. 9, the transmittances of Plastic layers A and B were observed to rise sharply in a wavelength band of between 400 nm and 500 nm inclusive. In contrast, the transmittance of Plastic layer C was observed to rise sharply in a wavelength band of between 300 nm and 350 nm inclusive.

In the first peeling step described above, a laser beam having a wavelength between 308 nm and 355 nm inclusive can be used. According to the measurement results, at 308 nm, the transmittance of Plastic layer A was 0.1%, the transmittance of Plastic layer B was 0.0%, and the transmittance of Plastic layer C was 0.1%. At 308 nm, the transmittance of Glass substrate A was 92.7%, the transmittance of Glass substrate B was 54.7%, and the transmittance of Glass substrate C was 1.3%. At 355 nm, the transmittance of Plastic layer A was 0.0%, the transmittance of Plastic layer B was 0.0%, and the transmittance of Plastic layer C was 85.1%. At 355 nm, the transmittance of Glass substrate A was 93.3%, the transmittance of Glass substrate B was 86.5%, and the transmittance of Glass substrate C was 83.4%.

In the first peeling step, in order to increase the efficiency of the plastic layer in absorbing the laser beam, the transmittance of the glass substrate is preferably higher than and significantly different from the transmittance of the plastic layer at the wavelength of the laser beam used in the first peeling step. In this regard, when the wavelength of the laser beam is 355 nm, one of Plastic layers A and B is preferably used as the plastic layer, and one of Glass substrates A to C is preferably used as the glass substrate. When the wavelength of the laser beam is 308 nm, one of Plastic layers A to C is preferably used as the plastic layer, and one of Glass substrates A and B is preferably used as the glass substrate.

As described above, the present embodiment of a method for manufacturing a vapor deposition mask has the following advantages.

(1) In the process of manufacturing the vapor deposition mask 30, the plastic layer 41 and the glass substrate 42 support the mask portion 32 having a plurality of mask holes 32H. In the vapor deposition mask 30, the mask frame 31 supports the mask portions 32. This allows the mask portion 32 to be thinner than that in a configuration in which the vapor deposition mask 30 consists only of the mask portion 32. Consequently, the shortened distance from one opening to the other of each mask hole 32H improves the accuracy of the structure of the pattern formed using the vapor deposition mask 30, while the rigidity of the mask frame 31 improves the handleability of the vapor deposition mask 30.

(2) The external force acting on the mask portion 32 is reduced as compared to a configuration that applies external force to the laminate of the glass substrate 42, the plastic layer 41, and the mask portion 32 to cause interface failure to peel off the glass substrate 42 and the plastic layer 41 from the mask portion 32. As a result, the peeling of the plastic layer 41 and the glass substrate 42 is less likely to deform the mask portion 32, and ultimately less likely to deform the mask holes 32H in the mask portion 32.

(3) The plastic layer 41 has a lower transmittance than the glass substrate 42. This increases the efficiency in heating the section of the plastic layer 41 that forms the interface between the glass substrate 42 and the plastic layer 41, as compared to a configuration in which the plastic layer 41 has a higher transmittance than the glass substrate 42.

(4) More than half the light quantity of laser beam L directed toward the glass substrate 42 passes through the glass substrate 42, and the plastic layer 41 absorbs most of the laser beam L that has passed through the glass substrate 42. This increases the efficiency in heating the section of the plastic layer 41 that forms the interface between the glass substrate 42 and the plastic layer 41.

(5) The mask portions 32 and the mask frame 31 are both made of an iron-nickel alloy, and the mask frame 31 is at least twice as thick as the mask portions 32. This enhances the mechanical strength of the vapor deposition mask 30.

(6) When the vapor deposition mask 30 is used for vapor deposition, the mask portions 32 are unlikely to warp, which would be otherwise caused by a difference in thermal expansion coefficient between the mask frame 31 and the mask portions 32. This avoids reduction in the accuracy of the shape of pattern formed using the vapor deposition mask 30.

(7) Even when the thickness of the mask portion 32 is extremely thin, the mask frame 31 that is at least ten times thicker than the mask portion 32 avoids reduction in the overall mechanical strength of the vapor deposition mask 30.

(8) The metal sheet 32S1 has a higher rigidity than the mask portion 32 of the vapor deposition mask 30. This facilitates the joining of the metal sheet 32S1 to the glass substrate 42 as compared to a configuration in which the metal sheet 32S1 joined to the glass substrate 42 has the same thickness as the mask portion 32.

(9) In the process of manufacturing the vapor deposition mask 30, heating the laminate of the mask sheet 32S, the plastic layer 41, and the glass substrate 42 is unlikely to warp the laminate, which would be otherwise caused by a difference in thermal expansion coefficient between the layers of the laminate.

(10) Etching the metal sheet 32S1 from the first and second surfaces reduces the thickness of the metal sheet 32S1 and also the residual stress of the metal sheet 32S1.

The above-described embodiment may be modified as follows.

The plastic layer 41 may be made from a plastic other than polyimide as long as it is removable from the mask portion 32. Nevertheless, to limit heat-induced warpage of the laminate of the mask portion 32, the plastic layer 41, and the glass substrate 42, the plastic layer 41 is preferably made of polyimide as described above.

The metal sheet 32S1, which is joined to the glass substrate 42 with the plastic layer 41 in between in the first joining step, may have a thickness of less than or equal to 30 μm.

Provided that the mask frame 31 has a higher rigidity than the mask portion 32, the mask frame 31 may have a thickness of less than or equal to 50 μm. Further, the mask frame 31 may be made of a metal other than Invar.

The first peeling step may use a laser beam L that has a wavelength of less than 308 nm or greater than 355 nm, as long as the irradiation with the laser beam L can reduce the strength of bonding between the plastic layer 41 and the glass substrate 42. Further, the transmittances of the plastic layer 41 and the glass substrate 42 for the laser beam L may be any values that allow the laser beam L to be absorbed by the plastic layer 41 so as to weaken the adhesion between the plastic layer 41 and the glass substrate 42. That is, the transmittance of the plastic layer 41 and the transmittance of the glass substrate 42 for the laser beam L are not limited to the values described above.

The first peeling step may be a step of peeling off the glass substrate 42 from the plastic layer 41 by a method other than the irradiation with the laser beam L. For example, the first peeling step may use a chemical solution to peel off the glass substrate 42 from the plastic layer 41. Alternatively, the first peeling step may physically peel off the glass substrate 42 from the plastic layer 41 by applying an external force between the glass substrate 42 and the plastic layer 41.

The plastic layer 41 and the glass substrate 42 may be peeled off from the mask sheet 32S at the same time. In other words, the plastic layer 41 and the glass substrate 42 may be peeled off from the mask sheet 32S in a single step. For example, the plastic layer 41 and the glass substrate 42 may be peeled off from the mask sheet 32S in a single step by using a chemical solution that dissolves the plastic layer 41.

The mask holes 32H in the metal sheet 32S1 do not have to be formed by wet etching using an etchant, and may be formed by applying laser beams to the metal sheet 32S1.

DESCRIPTION OF THE REFERENCE NUMERALS

10 . . . Mask Device; 20 . . . Main Frame; 21 . . . Main Frame Hole; 30 . . . Vapor Deposition Mask; 30BN . . . Joining Section; 31 . . . Mask Frame; 31E . . . Inner Edge Section; 31F . . . Frame Front Surface; 31R . . . Frame Back Surface; 32 . . . Mask Portion; 32E . . . Outer Edge Section; 32F . . . Mask Front Surface; 32H . . . Mask Hole; 32K . . . Substrate; 32R . . . Mask Back Surface; 32S . . . Mask Sheet; 32S1 . . . Metal Sheet; 33 . . . Mask Frame Hole; 41 . . . Plastic Layer; 42 . . . Glass Substrate; H1 . . . Front Surface Opening; H2 . . . Back Surface Opening; PR . . . Resist Layer; RM . . . Resist Mask; S . . . Vapor Deposition Target; V . . . Space

The invention claimed is:

1. A vapor deposition mask comprising:
a sheet-shaped mask portion made of an iron-nickel alloy and having a contact surface, which is configured to be in contact with a vapor deposition target, and a non-contact surface, which is opposite to the contact surface, wherein the mask portion includes a plurality of mask holes each extending from a first opening, which is located in the non-contact surface, to a second opening, which is located in the contact surface, and the second opening is smaller in size than the first opening; and
a mask frame that has a welding mark welded to the non-contact surface, has a higher rigidity than the mask portion, and is in a shape of a frame surrounding the mask holes,
the mask portion is formed by peeling off a plastic layer and a glass substrate from the mask portion after making the welding mark in a state where the glass substrate is joined to the contact surface with the plastic layer,
the welding mark is located on the non-contact surface opposite to the contact surface that follows the surface of the glass substrate.

2. The vapor deposition mask according to claim 1, wherein
the thickness of the mask portion is between 1 μm and 15 μm inclusive.

3. The vapor deposition mask according to claim 1, wherein
the vapor deposition mask has a plurality of mask portions,
the mask portion is one of the plurality of mask portions,
each mask portion is welded to the mask frame.

4. A method for manufacturing the vapor deposition mask according to claim 1, the method comprising:
sandwiching the plastic layer between the glass substrate and a metal plate made of an iron-nickel alloy and joining the metal plate to the glass substrate with the plastic layer in between;
forming the mask portion including the plurality of mask holes from the metal plate joined to the glass substrate;
joining a surface of the mask portion that is opposite to a surface of the mask portion that is in contact with the plastic layer to the mask frame, which has a higher rigidity than the mask portion and is in a shape of a frame surrounding the mask holes of the mask portion by irradiating a portion in the mask portion which is in contact with the mask frame through the glass substrate and the plastic layer with a laser beam to weld the mask frame to the mask portion and make a welding mark; and peeling off the plastic layer and the glass substrate from the mask portion which is joined to the mask frame.

\* \* \* \* \*